United States Patent [19]

Guerpont

[11] 4,267,507
[45] May 12, 1981

[54] CIRCUIT PROBING APPARATUS

[75] Inventor: Maurice R. Guerpont, Malakoff, France

[73] Assignee: Société Anonyme de Telecommunications, Paris, France

[21] Appl. No.: 14,573

[22] Filed: Feb. 23, 1979

[30] Foreign Application Priority Data

Feb. 24, 1978 [FR] France .............................. 78 05302

[51] Int. Cl.$^3$ ........................................... G01R 31/22
[52] U.S. Cl. .................................. 324/158 P; 324/62; 324/64; 324/73 PC; 324/158 F
[58] Field of Search ............. 324/64, 62, 65 P, 73 PC, 324/158 P, 158 F

[56] References Cited

U.S. PATENT DOCUMENTS

| | | | |
|---|---|---|---|
| 3,437,929 | 4/1969 | Glenn | 324/158 F |
| 3,590,372 | 6/1971 | DeSantis et al. | 324/64 |
| 3,702,437 | 11/1972 | McGrath | 324/158 F |
| 4,123,706 | 10/1978 | Roch | 324/158 F X |

OTHER PUBLICATIONS

Healy et al., Resistance Standard, IBM Technical Disclosure Bulletin, Jun. 1970, pp. 143,144.
Groenick et al., Integrated Circuit Full Wafer Diagnostic Using Special Test Stage For Scanning Electron Microscope, IBM Technical Disc. Bull., Jul. 1978, pp. 638,639.

*Primary Examiner*—Stanley T. Krawczewicz
*Attorney, Agent, or Firm*—Holman & Stern

[57] ABSTRACT

Apparatus for probing electric circuits, such as thick layer circuits or printed circuits, comprising at least two probe tips, support arms respectively carrying the probe tips, respective program-controlled displacement units to displace the support arms so that the probe tips may assume any desired position in a plane parallel to that of the circuit to be tested, and means for displacing the support arms between a high position and a low position in which the probe tips are in contact with the circuit.

4 Claims, 8 Drawing Figures

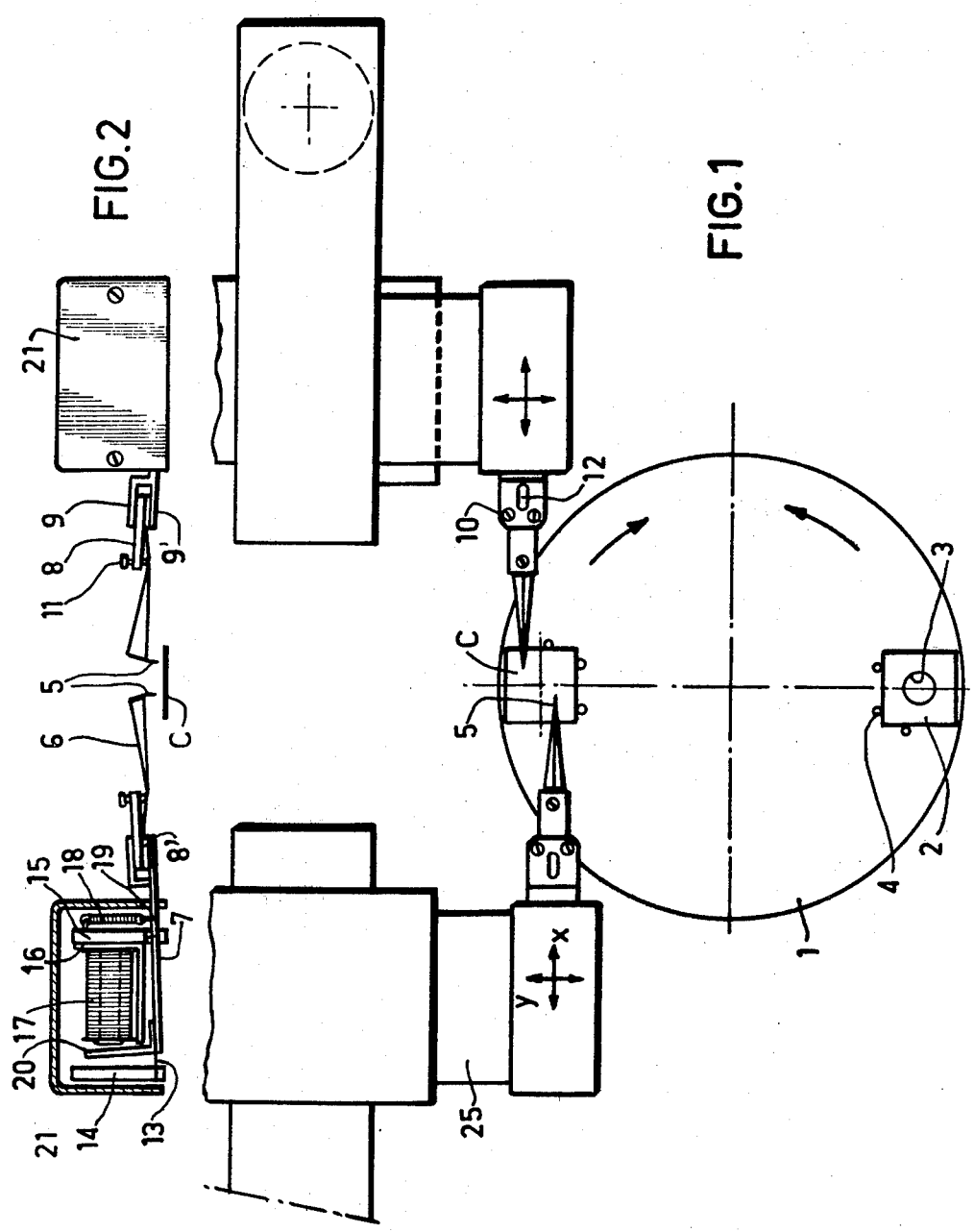

CIRCUIT PROBING APPARATUS

The present invention relates to an apparatus for probing electric circuits, such as thick layer circuits or printed circuits, which it is desired to test or of which the components are to be adjusted.

For establishing contacts on such a circuit, it is known to use a support generally in the form of a ring or crown carrying as many probe tips as there are contacts to be established. The probes have to be positioned separately to contact the access points of the various lines of the circuit.

All the probes tips are brought simultaneously into contact with the circuit and, for each line to be tested, the corresponding pair of contacts is selected by means of a set of relays.

Such a device, described for example in French patent application No. 2,356,341, is applicable only to simple circuits comprising a rather small number of lines. When this number is high, the number of probes must be high and the individual adjustment of each probe becomes very difficult.

In addition, when testing is employed for adjusting the resistors of the circuit, it is critical that the sandblast or the laser beam, directed perpendicularly to the surface of the printed circuit to effect adjustment thereof, does not meet the probe tips. This requirement is difficult to fulfill if the number of probes must be high.

Another drawback of the known device lies in that, since relays are present in the testing circuit, the resistances of the relays have to be taken into consideration in the results of tests.

U.S. Pat. No. 3,399,363 also describes an apparatus of this type, in which the probe tips are carried by support arms which are movable between a high position and a low position in which the probe tips are in contact with the circuit. This arrangement aims at enabling a large number of probe tips to be placed on the circuit, so as to effect a large number of tests, but it is clear that this number is in any case very limited. This known apparatus also presents the drawbacks already mentioned hereinabove.

The object of the invention is to provide an apparatus for probing a thick layer circuit or a printed circuit which does not present the above-indicated drawbacks.

In the apparatus according to the invention comprising at least two probe tips, support arms respectively carrying the probe tips and means for moving the support arms between a high position and a low position in which the probes are in contact with the circuit, there are provided respective program-controlled displacement units to displace the support arms so that the probe tips may assume any desired position in a plane parallel to that of the circuit to be tested.

In the apparatus according to the invention, the successive contacts are obtained by the programmed displacements of the two probe tips, this overcoming all the problems mentioned hereinabove.

Each displacement unit suitably comprises a lower plate, a first drive unit for displacing the lower plate in a first direction, an intermediate plate placed above the lower plate and movable with respect to said lower plate in a second direction at right angles to said first direction, the respective support arm being secured to the intermediate plate, an upper plate placed above the intermediate plate, a second drive unit for displacing the upper plate in said second direction, the intermediate plate being movable with respect to the upper plate in said first direction, and means for fixing the relative position of the two drive units in each of said directions.

In such a displacement unit, the parts to be driven are at any moment limited to the intermediate plate and to only one of the lower and upper plates, and therefore has a very low inertia. This is very important as this allows high speeds of displacements over the very short displacements which the probe tips effect, therefore appreciable saving of time. With the conventional system in which the lower plate, provided with a drive unit, carries the upper plate and the drive unit associated therewith, and the member to be displaced is fixed on the upper plate, as described for example in U.S. Pat. No. 3,399,363 mentioned above, the mobile parts may comprise the member to be displaced the two plates and the drive unit of the upper plate, this corresponding to a very considerable inertia. The speeds of displacement would then be very clearly lower and the time necessary for the operation would be much longer.

The invention will be more readily understood on reading the following description with reference to the accompanying drawings in which:

FIG. 1 is a schematic plan view of the probing apparatus according to the invention.

FIG. 2 is a front view, partly in section, which shows the support arms of the apparatus of FIG. 1.

FIG. 3b is a side view of one of the displacement unit shown in FIG. 3a.

Figure 3B:
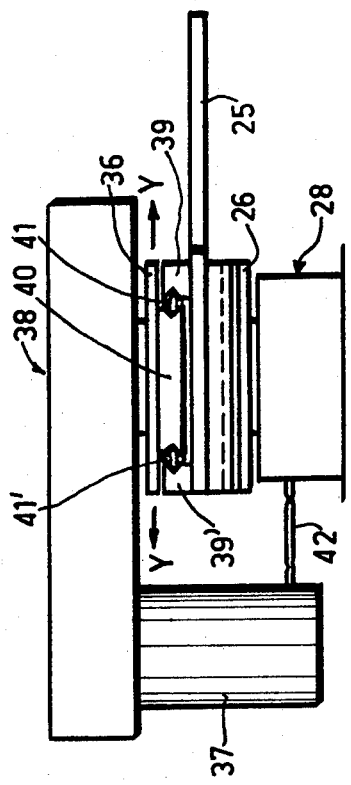

Referring now to the drawings, FIG. 1 shows a rotating plate 1 adapted to receive the circuits of which it is desired to test the different components. The rotating plate defines two locations 2, of which one receives a wafer C being tested while the other is intended to receive another wafer. The hole 3 which is visible at the unoccupied location serves to maintain the wafer by depression. Small stops 4 serve as references for positioning the wafers.

The probing apparatus comprises two probe tips 5 adapted to be placed at the terminals of the circuit component of which it is desired to test a characteristic, particularly a thick layer resistor. Each of the probe tips 5 constitutes the end of a body 6 made of conducting metal which is fixed in overhang to the end of a support arm 7.

The body 6 may be fixed to the support arm 7 in any manner provided that it allows a limited adjustment in height of the end of the probe tip 5. In the example described, the body 6 terminates in a thin, slightly flexible tongue, gripped between two shims 8,8' made of insulating material. The shims 8,8' are held between the arms 9,9' of the bifurcated support arm 7, the arms 9,9' being brought slightly closer to each other by screws 10 so as to clamp the shims in position.

Moreover, the upper shim 8 comprises an extension which carries a screw 11 for adjusting the probe tip 5 in height. It will also be noted that the upper arm 9 is provided with an opening 12 for the passage of an electric connnection (not shown) directly connecting the body 6 to an electrical testing apparatus.

As may be seen in FIG. 2, each support arm is fixed at its end remote from arms 9,9' to a slightly flexible leaf 13 which is clamped by means (not shown), for example a screw, to a frame member 14. Another frame member 15 parallel to member 14 carries a square 16 on which is mounted an electromagnet coil 17. Moreover, a draw spring 18 is mounted between the frame member 15 and the support arm 7 and biases the latter into contact with a stop surface 19 defined by an opening made in the member 15. An L-shaped element 20, preferably made of soft iron is fixed to the leaf 13 on the side remote from the support arm 7 and comprises a part adapted to be attracted by the electromagnet 17 when said latter is energized. When this happens, the movement of the element 20 towards the electro-magnet brings about a lowering of the support arm 7 due to pivoting of the leaf 13. The probe tip 5 carried by the support arm thus comes into contact with the circuit C. When the electromagnet is then de-energized, the attraction ceases and the spring 18 returns the support arm 7 into the high position shown in FIG. 2. The probe tip then moves away from the circuit.

The low position corresponds, of course, to the testing steps during which the prods are stationary, and the high position corresponds to the displacements of the probe tips from one point of the circuit to another.

The arrows X, Y in FIG. 1 indicated the two orthogonal axes of displacement of the support arms 7 carrying the probe tips. For driving the support arms, the two frame members 14, 15 are secured, for example by screws (not shown), to a plate 25 driven along the axes X, Y by means which will be described in detail hereinafter with reference to FIGS. 3-6. In addition, a protective casing 21 fixed to the frame members 14, 15 surrounds the electromagnet 17.

Figure 3A:
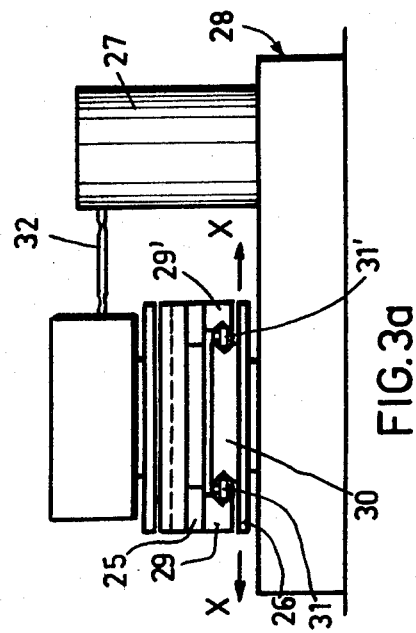
FIG. 3a is a front view of one of the displacement units.
Figure 4:
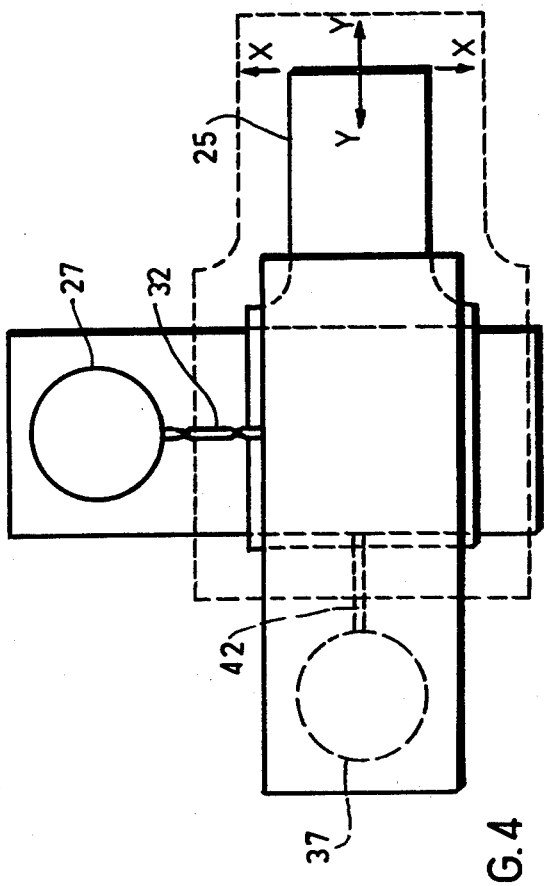
FIG. 4 is a plan view of the displacement unit of FIGS. 3a and 3b.

Reference will now be made to FIGS. 3a, 3b and 4 which show a preferred embodiment of the means for displacing the plate 26 along axes X, Y.

The plate 25 which will be referred to hereinafter as intermediate plate, is sandwiched between two plates, a lower plate 26 and an upper plate 36. The lower plate 26 is driven in direction X (cf. FIG. 3a) by a drive unit comprising a stepping motor 27 and a transmission mechanism generally designated at 28 and described in greater detail hereinafter with reference to FIGS. 5 and 6a–6b. On the other hand, the intermediate plate 25 is mounted to be movable with respect to the lower plate 26 in the direction at right angles to the direction X, i.e. in the direction Y. To this end, any suitable means may be used. In the example described, the intermediate plate extends downwardly into guide elements 29, 29' located on its edges parallel to the direction Y, the lower plate 26 comprises a central guide element 30, and crossed rollers 31, 31' of known type are mounted between the surfaces, opposite the guide elements, which are shaped correspondingly, i.e. provided with a V-section. The crossed rollers allow a displacement without any friction of the intermediate plate 25 with respect to the lower plate 26.

However, it will be noted that ball bearings may also be used in lieu of the crossed rollers.

The upper part of the displacement unit is identical to the lower part which has just been described, and is disposed perpendicularly thereto. The upper plate 36 is driven in direction Y (cf. FIG. 3b) by a stepped motor 37 via a transmission mechanism 38. The intermediate plate 25 comprises lateral guide elements 39, 39' on its edges parallel to the direction X, which cooperate with a central guide element 40 of the upper plate via crossed rollers 41, 41'.

In addition, a reaction rod 32 is mounted between the stepping motor 27 and the casing of the transmission mechanism 38 to fix the relative position of the two drive assemblies along direction X, and a reaction rod 42 is mounted between the motor 37 and the casing of the transmission mechanism 28 to fix the relative position of the two drive assemblies along direction Y.

When a displacement along direction X must be effected, the motor 27 is started up, it drives the lower plate 26 which, itself, drives the intermediate plate 25 in the direction X. During this displacement, the upper plate 36 remains stationary and the displacement imparted to the intermediate plate 25 causes the latter to slide with respect to the upper table. When a displacement in the direction Y is to be produced, motor 37 is started up and the upper plate 36 drives the intermediate plate 25, which thus slides with respect to the lower plate 26 which remains stationary.

The essential advantage of the displacement unit described is associated with its symmetrical structure, and lies in the fact that the moving parts are limited at any moment to the intermediate plate 25 (plus the very light pieces which it carries) and to only one of the lower and upper plates. The resultant inertia is therefore very reduced, this enabling relatively very high speeds of displacement, of up to 50 mm/s, to be attained. A very low inertia is an essential requirement in this type of apparatus, as the displacements are extremely short, of the order of 1 to 5 mm—the wafer of circuit C having e.g. dimentions of about 25×25 mm. If the inertia were high, the braking phase in the course of a given displacement would already have to occur well before the end of the acceleration phase so that the normal speed could never be attained. The total duration of the operation would be extended to considerable proportions.

Another advantage resides in the standardization of the equipment since the upper and lower drive assemblies are composed of identical, and therefore interchangeable elements.

Figure 5:
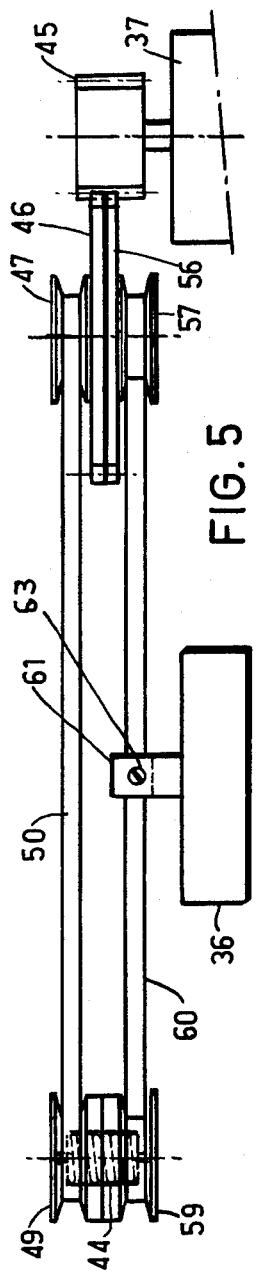
FIG. 5 is a front view, at an enlarged scale, of the transmission mechanism for driving one of the tables of the displacement unit.
Figure 6A:
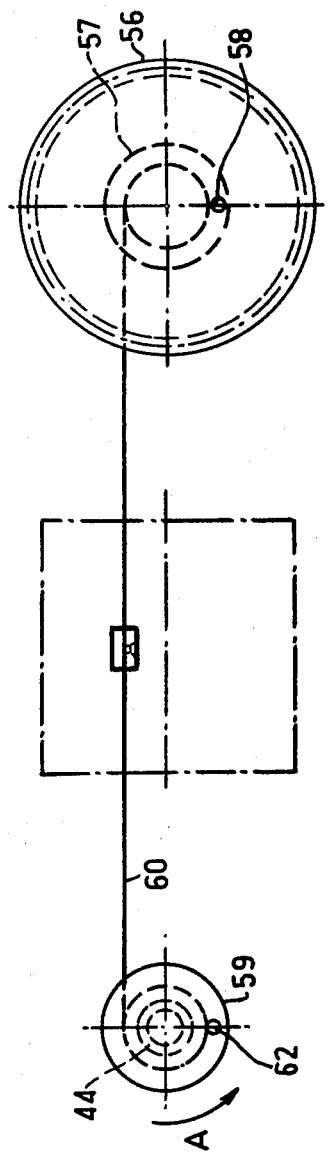
FIG. 6a shows a plan view of the lower half of the transmission mechanism of FIG. 5.
Figure 6B:
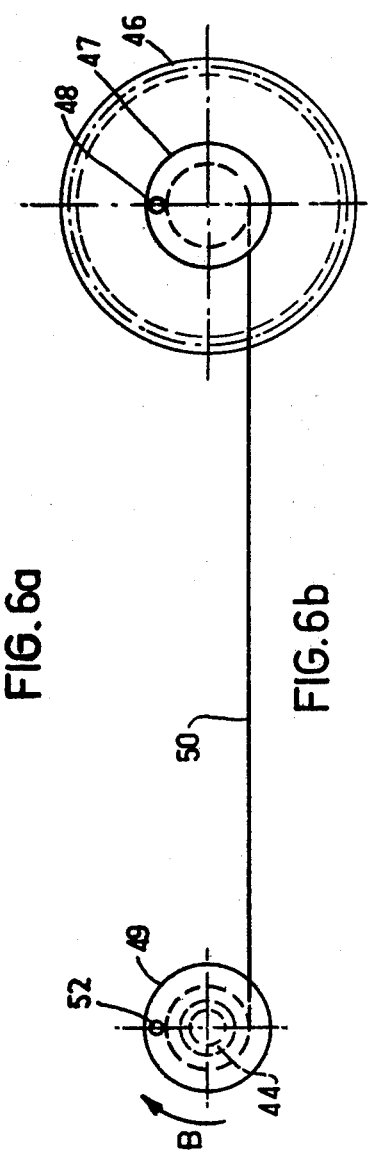
FIG. 6b shows a plan view of the upper half of the transmission mechanism of FIG. 5.

Reference is now made to FIGS. 5 and 6a, 6b which show, in detail, the transmission mechanism designated by references 28, 38 in FIGS. 3a, 3b. It will be assumed that here it is question of mechanism 38. This mechanism connects the stepping motor 37 to the upper plate 36. It comprises a pinion 45 mounted on the driven shaft of the motor 37 which meshes with two gear wheels 46, 56 rotatably mounted on a shaft (not shown), symbolised by the phantom line. A pulley 47 is secured to the upper wheel 46 (cf. FIG. 6b). Similarly, a pulley 57 is secured to the lower wheel 56 (cf. FIG. 6a).

The upper pulley 47 is connected to a pulley 49 by a metal band 50—fixed thereon by means of keys 48 and 52—so as to rotate the pulley 49 when the wheels 46, 56 rotate in anticlockwise direction, seen in FIG. 6b. The lower pulley 57 is likewise connected to a pulley 59 by a metal band 60—fixed on these pulleys by keys 58 and 62—so as to rotate said pulley when the wheels 46, 56 rotate clockwise. An element 61 fixed to the plate 36 is provided with a slot in which the band 60 is introduced, and a screw 63 tightens the band so as to ensure a drive without slide of the element 61 by the band 60. In the position of FIGS. 6a, 6b, the points of fastening of the bands 50, 60 are half-way along. The total rotational travel of the pulleys is ±135° with respect to this position. A band can therefore never wind on itself.

On the other hand, the pulleys 49 and 59 are mounted to be mutually coaxial and a torsion spring 44 is mounted inside the pulleys 49, 59 so that its upper end is fixed to the upper pulley 49 and its lower end to the lower pulley 59. The spring 44 consequently exerts a return force on the upper pulley 49 which tends to cause the latter to rotate in the direction of arrow B of FIG. 6b, and exerts on the lower pulley 59 a force which tends to cause it to rotate in the direction indicated by arrow A in FIG. 6a. In either case, the force exerted by the spring 44 opposes the pulling force exerted on the pulleys 49, 59 by the respective bands 50, 60. The spring 44 therefore permanently ensures a compensation for the clearance which inevitably occurs between the gears 45 and 46, 56. A high precision is thus obtained in the transmission of the movement from the motor 27 to the plate 26. The elimination of the clearances provided by the spring 44 is very important in view of the fact that the movement made by a probe tip is constituted by a succession of very short displacements.

The stepping motors 27, 37 are controlled from a program established for the circuit to be tested. This program may be recorded on a support such as a punched tape or simply recorded in the memory of a micro-computer.

The program also controls the energization of the electro-magnet 17 so that the latter remains de-energized during the displacement of the respective probe tip and is energized at the end of the displacement. The probe tip then comes into contact with the circuit and the testing step may take place. Once the testing is made, the electro-magnet is de-energized, the probe tip is raised and a further displacement may begin.

The apparatus according to the invention may very advantageously be combined with a laser beam machining head or a sandblasting head, with a view to effecting the adjustment of the resistors of the circuit to the specified values. In this case, the displacements of the machining head and of the probe tips are coupled, i.e. the machining head is directed on the resistor at the terminals of which are placed the probe tips, and the operation of the machining head is controlled with the result of the test. Machining is stopped when the measured value becomes equal, apart from the tolerances, to the theoretical specified value.

In such an application it is absolutely critical to avoid that one of the probe tips stands in the path of the laser beam or the sandblast, but this does not present difficulties with the apparatus according to the invention, which has only two probe tips whatever be the number of components to be adjusted.

It should further be emphasized that the apparatus allow the adjustment of the resistors and the final test after addition of the discrete components. This would not be possible at all with the conventional ring-shaped device.

What is claimed is:

1. An apparatus for probing an electric circuit, comprising at least two probe tips, support arms respectively carrying the probe tips, means for displacing the support arms between a high position and a low position in which the probe tips are in contact with the circuit, and respective program-controlled displacement units to displace the support arms so that the probe tips may assume any desired position in a plane parallel to that of the circuit to be tested, each displacement unit comprising a lower plate, a first drive unit for displacing the lower plate in a first direction, an intermediate plate placed above the lower plate and movable with respect to said lower plate in a second direction at right angles to said first direction, the respective support arm being secured to the intermediate plate, an upper plate placed above the intermediate plate, a second drive unit for displacing the upper plate in said second direction, the intermediate plate being movable with respect to the upper plate in said first direction, and means for fixing the relative position of the two drive units according to each of said directions.

2. An apparatus according to claim 1, wherein each drive unit comprises a stepping motor, a transmission mechanism comprising two coaxial driving pulleys driven by the motor in the same direction, two coaxial driven pulleys, two non-extensible bands connecting the driving pulleys respectively to the driven pulleys, said bands being mounted so as to move in opposite directions, a torsion spring connected by its respective ends to the driven pulleys, said spring acting to oppose the pulling force exerted by the bands on the respective driven pulleys, and a coupling element for connecting the associated plate to one of said bands.

3. An apparatus according to claim 2, wherein a reaction rod directed in each of said directions is mounted between the motor of the drive unit in said direction and the transmission mechanism of the drive unit in the other direction.

4. An apparatus according to claim 1, wherein each support arm is pivotally mounted on the respective intermediate plate and is displaceable into the low position by an electromagnet carried by the intermediate plate against the action of a spring.

* * * * *